(12) United States Patent
Hu et al.

(10) Patent No.: US 8,304,923 B2
(45) Date of Patent: Nov. 6, 2012

(54) CHIP PACKAGING STRUCTURE

(75) Inventors: Dyi-Chung Hu, Hsinchu County (TW);
Yu-Shan Hu, Taoyuan County (TW);
Chih-Wei Lin, Tainan County (TW)

(73) Assignee: ADL Engineering Inc., Hsinchu County (TW)

( * ) Notice: Subject to any disclaimer, the term of this patent is extended or adjusted under 35 U.S.C. 154(b) by 570 days.

(21) Appl. No.: 11/692,933

(22) Filed: Mar. 29, 2007

(65) Prior Publication Data
US 2008/0237834 A1    Oct. 2, 2008

(51) Int. Cl.
*H01L 23/02* (2006.01)
*H01L 23/48* (2006.01)
*H01L 23/52* (2006.01)
*H01L 23/28* (2006.01)

(52) U.S. Cl. ........ 257/787; 257/686; 257/690; 257/693; 257/E23.124; 257/E25.013

(58) Field of Classification Search .......... 257/686, 257/690, 693, 787, 697, 777, E23.124, E25.006, 257/E25.013
See application file for complete search history.

(56) References Cited

U.S. PATENT DOCUMENTS

| | | | | |
|---|---|---|---|---|
| 5,674,785 A * | 10/1997 | Akram et al. | ........ | 438/15 |
| 6,222,259 B1 * | 4/2001 | Park et al. | ........ | 257/690 |
| 6,235,554 B1 * | 5/2001 | Akram et al. | ........ | 438/109 |
| 6,538,210 B2 * | 3/2003 | Sugaya et al. | ........ | 174/258 |
| 6,646,334 B2 * | 11/2003 | Hur | ........ | 257/686 |
| 6,774,478 B2 * | 8/2004 | Eto et al. | ........ | 257/686 |
| 6,784,551 B2 * | 8/2004 | Auburger et al. | ........ | 257/767 |
| 7,056,764 B2 * | 6/2006 | Auburger et al. | ........ | 438/106 |
| 7,190,080 B1 * | 3/2007 | Leu et al. | ........ | 257/778 |
| 7,196,408 B2 * | 3/2007 | Yang et al. | ........ | 257/686 |
| 7,262,082 B1 * | 8/2007 | Lin et al. | ........ | 438/109 |
| 2002/0066952 A1 * | 6/2002 | Taniguchi et al. | ........ | 257/698 |
| 2002/0109236 A1 * | 8/2002 | Kim et al. | ........ | 257/777 |
| 2002/0142513 A1 * | 10/2002 | Fee et al. | ........ | 438/106 |
| 2002/0180041 A1 * | 12/2002 | Sahara et al. | ........ | 257/738 |
| 2003/0025188 A1 * | 2/2003 | Farnworth et al. | ........ | 257/686 |
| 2003/0052702 A1 * | 3/2003 | Auburger et al. | ........ | 324/753 |
| 2003/0057446 A1 * | 3/2003 | Auburger et al. | ........ | 257/200 |
| 2004/0070064 A1 * | 4/2004 | Yamane et al. | ........ | 257/686 |
| 2004/0154163 A1 * | 8/2004 | Miyazaki et al. | ........ | 29/832 |
| 2005/0001329 A1 * | 1/2005 | Matsuki et al. | ........ | 257/777 |
| 2005/0184377 A1 * | 8/2005 | Takeuchi et al. | ........ | 257/686 |
| 2006/0001147 A1 * | 1/2006 | Tomita et al. | ........ | 257/690 |
| 2006/0043569 A1 * | 3/2006 | Benson et al. | ........ | 257/698 |
| 2006/0231939 A1 * | 10/2006 | Kawabata et al. | ........ | 257/686 |
| 2007/0007639 A1 * | 1/2007 | Fukazawa | ........ | 257/686 |
| 2007/0029660 A1 * | 2/2007 | Baek | ........ | 257/686 |
| 2007/0259517 A1 * | 11/2007 | Benson et al. | ........ | 438/618 |
| 2008/0157302 A1 * | 7/2008 | Lee et al. | ........ | 257/676 |

* cited by examiner

*Primary Examiner* — Teresa M Arroyo
(74) *Attorney, Agent, or Firm* — Jianq Chyun IP Office

(57) ABSTRACT

A chip packaging structure comprising a chip, a plurality of conductive pillars surrounding the chip, an encapsulation encapsulating the chip and the conductive pillars, and a connecting layer is provided. The encapsulation has a first side and a second side corresponding to the first side. The connecting layer is disposed at the first side of the encapsulation and electrically connected between the chip and the conductive pillars. Furthermore, a chip packaging process accompanying the chip packaging structure is also provided. The chip packaging structure is more useful and powerful and is suitable for various chip packaging applications, and the chip packaging process can reduce the manufacturing time and save the production cost.

15 Claims, 13 Drawing Sheets

US 8,304,923 B2

CHIP PACKAGING STRUCTURE

BACKGROUND OF THE INVENTION

1. Field of the Invention

The present invention generally relates to a semiconductor device and a manufacturing method thereof. More particularly, the present invention relates to a chip packaging structure and a chip packaging process.

2. Description of Related Art

Compared to the conventional package technology which works with die, wafer-level package (WLP) processes the entire wafer. In other words, WLP performs back-end packaging process to a plurality of chip units at the same time. Thus, the chip packaging process is simplified, and the time and cost of the chip packaging process are reduced. That is, after the devices, circuits, and the related front-end semiconductor processes have been completed, the back-end packaging process can be directly performed over an entire carrier, and then singulation process is performed to form a plurality of chip packaging structures.

In today's developing optoelectronic industry, mature semiconductor manufacturing technologies have been widely applied to optoelectronic devices and the design of optoelectronic devices are continuously going towards minimization and multi-functionality. For example, the typical optoelectronic devices using semiconductor manufacturing process technologies include charge-coupled device (CCD), complementary metal-oxide semiconductor (CMOS) image sensor etc. Similarly, the time and cost for mass-manufacturing optoelectronic devices with foregoing wafer-level package process can also be reduced.

SUMMARY OF THE INVENTION

Accordingly, the present invention is directed to a chip packaging structure, which is more useful and powerful and is suitable for various chip packaging applications.

The present invention is also directed to a chip packaging process, which can reduce the manufacturing time and save the production cost.

As embodied and broadly described herein, the present invention provides a chip packaging structure, comprising a chip, a plurality of conductive pillars surrounding the chip, an encapsulation encapsulating the chip and the conductive pillars, and a connecting layer. The encapsulation has a first side and a second side corresponding to the first side. The connecting layer is disposed at the first side of the encapsulation and electrically connected between the chip and the conductive pillars.

According to an embodiment of the present invention, the chip packaging structure further comprises a trace layer disposed at the second side of the encapsulation and electrically connected to the conductive pillars. In this case, the chip packaging structure may further comprise a plurality of solder balls disposed at the second side of the encapsulation and electrically connected to the conductive pillars through the trace layer. In addition, the chip packaging structure may further comprise an adhesive layer disposed between the chip and the trace layer.

According to an embodiment of the present invention, each conductive pillar has a first end surface at the first side of the encapsulation and a second end surface at the second side of the encapsulation, and at least one of the first end surface and the second end surface of each conductive pillar is exposed by the encapsulation. In this case, the chip packaging structure may further comprise a plurality of solder balls disposed on the second end surface of each conductive pillar as the encapsulation exposing the second end surface of each conductive pillar.

According to an embodiment of the present invention, the chip is a sensing device having an active region at the first side of the encapsulation. In this case, the encapsulation may have an opening exposing the active region of the sensing device. In addition, the chip packaging structure may further comprise a transparent covering plate disposed at the first side of the encapsulation for covering the opening.

According to an embodiment of the present invention, the material of the encapsulation is a photosensitive material.

The present invention also provides a chip packaging process, comprising: providing a carrier; forming a plurality of conductive pillars over the carrier; disposing a chip over the carrier, wherein the conductive pillars surround the chip; forming an encapsulation over the carrier for encapsulating the chip and the conductive pillars, wherein the encapsulation has a first side adjacent to the carrier and a second side far away from the carrier; forming a connecting layer at the first side of the encapsulation for electrically connecting the chip and the conductive pillars; and removing the carrier.

According to an embodiment of the present invention, the chip packaging process may further comprises forming a trace layer on the carrier and then forming the conductive pillars on and bonding the chip to the trace layer. In this case, the method of bonding the chip to the trace layer may comprise providing an adhesive layer between the chip and the trace layer and then disposing the chip on the trace layer through the adhesive layer. In addition, the chip packaging process may further comprise forming a plurality of solder balls at the second side of the encapsulation after removing the carrier, wherein the solder balls are electrically connected to the conductive pillars through the trace layer.

According to an embodiment of the present invention, the chip packaging process further comprises forming a plurality of solder balls at the second side of the encapsulation after removing the carrier, wherein the solder balls are electrically connected to the conductive pillars.

According to an embodiment of the present invention, the chip is a sensing device having an active region at the first side of the encapsulation. In this case, the chip packaging process may further comprise forming an opening in the encapsulation for exposing the active region of the sensing device. In addition, the chip packaging process further comprises disposing a transparent covering plate at the first side of the encapsulation for covering the opening.

According to an embodiment of the present invention, the carrier comprises a base layer and a barrier layer formed on the base layer. The barrier layer may be formed by performing a plating process.

According to an embodiment of the present invention, the trace layer is formed by performing a plating process.

According to an embodiment of the present invention, the conductive pillars are formed by performing a plating process.

According to an embodiment of the present invention, the carrier is removed by performing an etching process.

The present invention further provides another chip packaging process, comprising: providing a carrier; disposing a chip over the carrier; forming an encapsulation over the carrier for encapsulating the chip, wherein the encapsulation has a first side adjacent to the carrier and a second side far away from the carrier; patterning the encapsulation to form a plurality of first openings over the chip and a plurality of second openings over the carrier outside of the chip; performing a plating process to form a plurality of conductive pillars in the second openings of the encapsulation; forming a connecting layer at the first side of the encapsulation for electrically connecting the conductive pillars and the chip through the first openings; and removing the carrier.

According to an embodiment of the present invention, the chip packaging process further comprises forming a trace layer on the carrier and then bonding the chip to the trace layer. In this case, the method of bonding the chip to the trace layer comprises, for example, providing an adhesive layer between the chip and the trace layer and then disposing the chip on the trace layer through the adhesive layer. In addition, the chip packaging process may further comprise forming a plurality of solder balls at the second side of the encapsulation after removing the carrier, wherein the solder balls are electrically connected to the conductive pillars through the trace layer.

According to an embodiment of the present invention, the chip packaging process may further comprise forming a plurality of solder balls at the second side of the encapsulation after removing the carrier, wherein the solder balls are electrically connected to the conductive pillars.

According to an embodiment of the present invention, the chip is a sensing device having an active region at the first side of the encapsulation. In this case, the chip packaging process may further comprise forming an opening in the encapsulation for exposing the active region of the sensing device. In addition, the opening may be formed as patterning the encapsulation. Furthermore, the chip packaging process may further comprise disposing a transparent covering plate at the first side of the encapsulation for covering the opening.

According to an embodiment of the present invention, the carrier comprises a base layer and a barrier layer formed on the base layer. The barrier layer may be formed by performing a plating process.

According to an embodiment of the present invention, the trace layer is formed by performing a plating process.

According to an embodiment of the present invention, the conductive pillars are formed by performing a plating process.

According to an embodiment of the present invention, the carrier is removed by performing an etching process.

The present invention provides further another chip packaging process, comprising: providing a multi-layered substrate comprising a first metal layer, a second metal layer and a barrier layer between the first metal layer and the second metal layer; patterning the first metal layer to form a plurality of conductive pillars; disposing a chip on the barrier layer, wherein the chip is surrounded by the conductive pillars; forming an encapsulation over the barrier layer for encapsulating the chip and the conductive pillars, wherein the encapsulation has a first side adjacent to the barrier layer and a second side far away from the barrier layer; forming a connecting layer at the first side of the encapsulation for electrically connecting the conductive pillars and the chip; and removing the barrier layer and the second metal layer.

According to an embodiment of the present invention, the chip packaging process further comprises forming a trace layer at the second side of the encapsulation after removing the barrier layer and the second metal layer. In addition, the chip packaging process may further comprises forming a plurality of solder balls at the second side of the encapsulation after removing the barrier layer and the second metal layer, wherein the solder balls are electrically connected to the conductive pillars through the trace layer.

According to an embodiment of the present invention, the chip packaging process further comprises forming a plurality of solder balls at the second side of the encapsulation after removing the barrier layer and the second metal layer, wherein the solder balls are electrically connected to the conductive pillars.

According to an embodiment of the present invention, the chip is a sensing device having an active region at the first side of the encapsulation. The chip packaging process may further comprise forming an opening in the encapsulation for exposing the active region of the sensing device. Furthermore, a transparent covering plate may be disposed at the first side of the encapsulation for covering the opening.

According to an embodiment of the present invention, the barrier layer and the second metal layer are removed by performing an etching process.

The present invention also provides a stacked chip packaging structure, comprising a plurality of chip packaging modules and a plurality of connecting elements. Two adjacent chip packaging modules are stacked with each other. Each chip packaging module comprises a chip, a plurality of conductive pillars surrounding the chip, an encapsulation, and a connecting layer, wherein the encapsulation having a first side and a second side corresponding to the first side encapsulates the chip and the conductive pillars, and the connecting layer is disposed at the first side of the encapsulation and electrically connected between the chip and the conductive pillars. The connecting elements are electrically connected between the corresponding conductive pillars of two adjacent chip packaging modules.

According to an embodiment of the present invention, each chip packaging module further comprises a trace layer disposed at the second side of the encapsulation and electrically connected to the conductive pillars and the corresponding connecting elements. In addition, each chip packaging module may further comprise an adhesive layer disposed between the chip and the trace layer.

According to an embodiment of the present invention, each conductive pillar has a first end surface at the first side of the corresponding encapsulation and a second end surface at the second side of the corresponding encapsulation, and at least one of the first end surface and the second end surface of each conductive pillar is exposed by the corresponding encapsulation. In addition, each connecting element may be disposed on the second end surface of the corresponding conductive pillar as the corresponding encapsulation exposing the second end surface of the corresponding conductive pillar.

According to an embodiment of the present invention, the chip of each chip packaging module is a sensing device having an active region at the first side of the corresponding encapsulation. The encapsulation may have an opening exposing the active region of the sensing device. In addition, each chip packaging module may further comprise a transparent covering plate disposed at the first side of the encapsulation for covering the opening.

According to an embodiment of the present invention, the material of the encapsulations is a photosensitive material.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
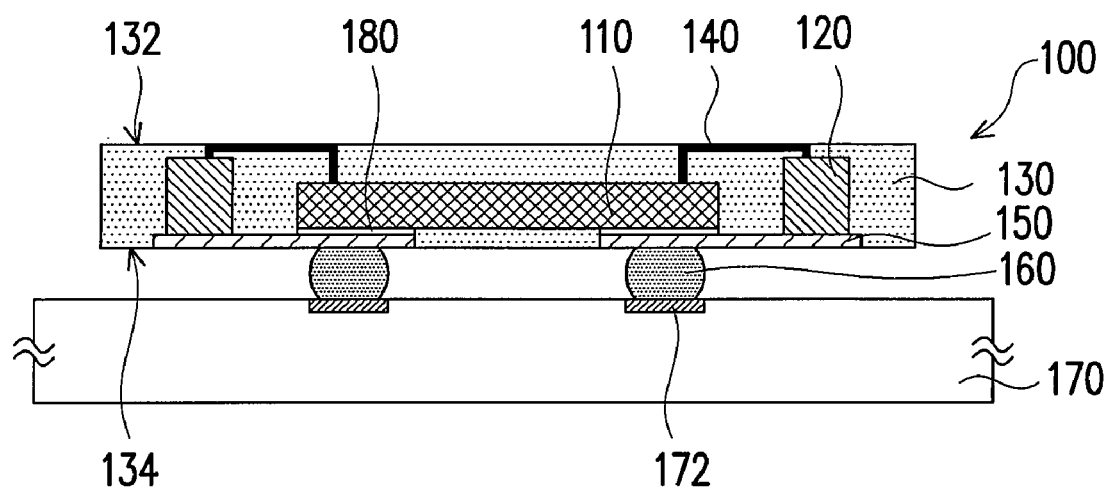
FIG. 1 illustrates a chip packaging structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, which illustrates a chip packaging structure according to an embodiment of the present invention. The chip packaging structure 100 comprises comprising a chip 110, a plurality of conductive pillars 120, an encapsulation 130, a connecting layer 140, and a trace layer 150. The conductive pillars 120 surround the chip 120, and the encapsulation 130 encapsulating the chip 110 and the conductive pillars 120. In addition, the encapsulation 130 has a first side 132 and a second side 134 corresponding to the first side 132. The connecting layer 140 is disposed at the first side 132 of the encapsulation 130 and electrically connected between the chip 110 and the conductive pillars 120. Besides, the material of the encapsulation 130 may be a photosensitive material.

The trace layer 150 is disposed at the second side 134 of the encapsulation 130 and electrically connected to the conductive pillars 120. Besides, the chip 110 may be disposed on the trace layer 150 through an adhesive layer 180. By the connecting layer 140, the conductive pillars 120, and the trace layer 150, contacts of the chip 110 can be redistributed from the first side 132 of the encapsulation 130 to the second side 134 of the same. Accordingly, a package with a chip facing up and having contacts at a back side of the chip is carried out.

The chip packaging structure 100 may further comprises solder balls 160 disposed on the second side 134 of the encapsulation 130 so as to communicate with external circuitries, such as a circuit board 170, through the solder balls 160. In this embodiment, the solder balls 160 are located below the chip 110 and electrically connected to the conductive pillars 120 through the trace layer 150. The contacts 172 of the circuit board 170 are electrically connected to the corresponding conductive pillars 120 through the solder balls 160 and the trace layer 150.

The trace layer 150 in the above embodiment is used for rearranging the locations of the solder balls 160 to comply with the circuit layout of various external circuitries. However, referring to FIG. 2, which illustrates the chip packaging structure 100 according to another embodiment of the present invention, the trace layer 150 can further be omitted as disregarding restriction of the circuit layout or for some specific applications, such as the stacked package described in the following. Thereby, the solder balls 160 can be directly connected to the conductive pillars 120 without the trace layer 150. For a detailed description of other elements and associated disposition within the chip packaging structure, please refer to the aforementioned embodiments, and a detailed description will not be repeated herein.

Figure 3:
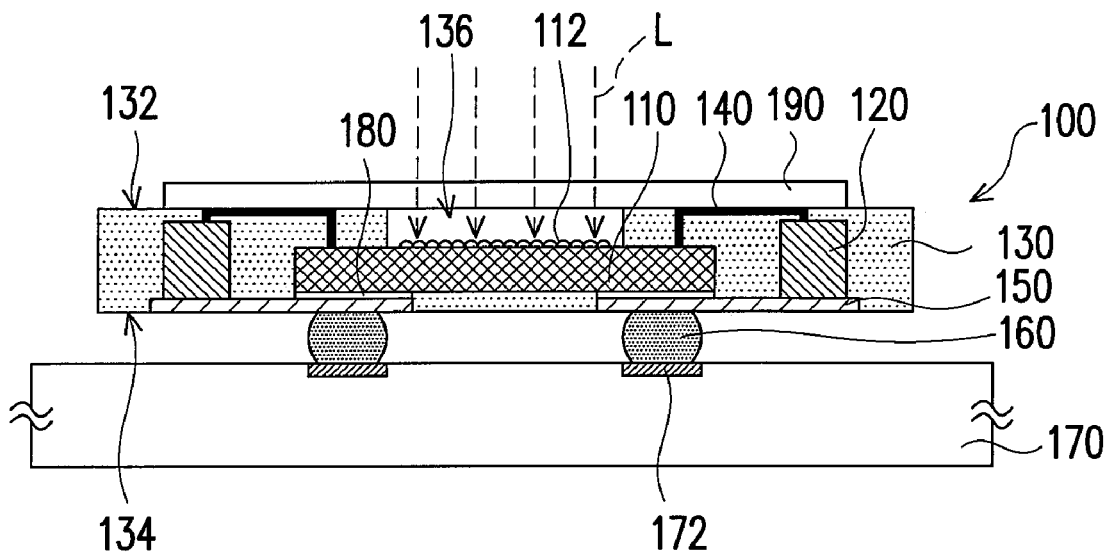
FIGS. 3-5 illustrate other chip packaging structures according to different embodiments of the present invention.

FIG. 3 illustrates further another chip packaging structure according to an embodiment of the present invention. In this embodiment, the chip 110 may be a sensing device, such as CCD or CMOS image sensor etc., having an active region 112 at the first side 132 of the encapsulation 130. Accordingly, the encapsulation 130 may have an opening 136 for exposing the active region 112 of the chip 110, and the active region 112 of the chip 110 can hereby receive external light L through the opening 136. In addition, the chip packaging structure 100 may further comprise a transparent covering plate 190, for example a glass plate, disposed at the first side 132 of the encapsulation 130 and covering the opening 136 to protect the active region 112 of the chip 110. For a detailed description of other elements and associated disposition within the chip packaging structure, please refer to the aforementioned embodiments, and a detailed description will not be repeated herein.

Figure 4:
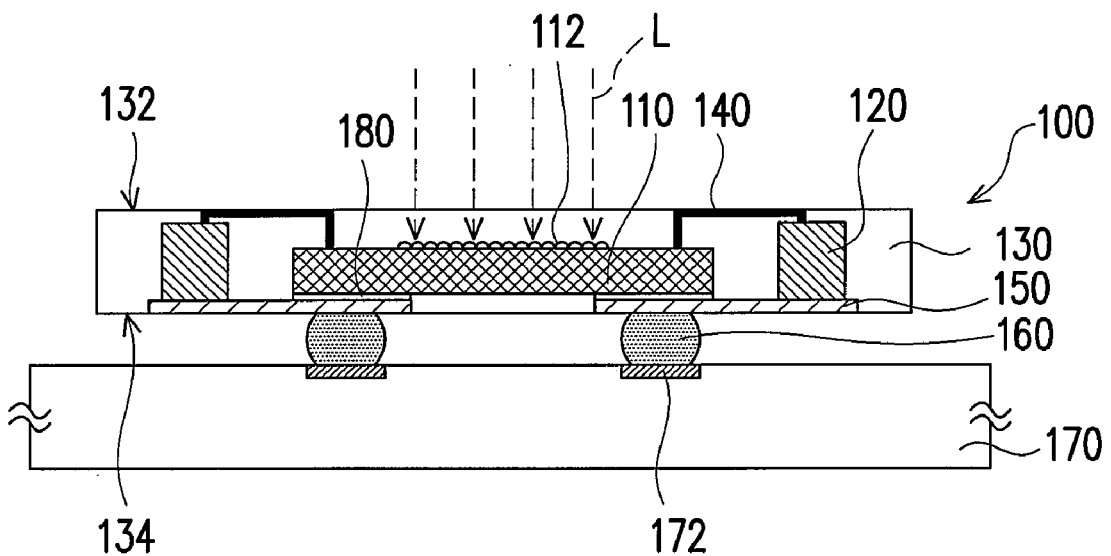

Furthermore, referring to FIG. 4, as illustrated in another embodiment of the present invention, a transparent material can be adopted to form the encapsulation 130. Therefore, external light L can be incident into the encapsulation 130 directly and received by the active region 112 of the chip 110 without forming any opening in the encapsulation 130 and disposing covering plate thereon. For a detailed description of other elements and associated disposition within the chip packaging structure, please refer to the aforementioned embodiments, and a detailed description will not be repeated herein.

It is noted that the chip packaging structure 100 of the aforementioned embodiments has conductive pillars 120, each of which having a first end surface 122 at the first side 132 of the encapsulation 130 and a second end surface 124 at the second side 134 of the encapsulation 130. As shown in FIGS. 1-4, the second end surface 122 of each conductive pillar 120 is exposed by the encapsulation 130 for connecting with the trace layer 150 or the solder balls.

Figure 5:
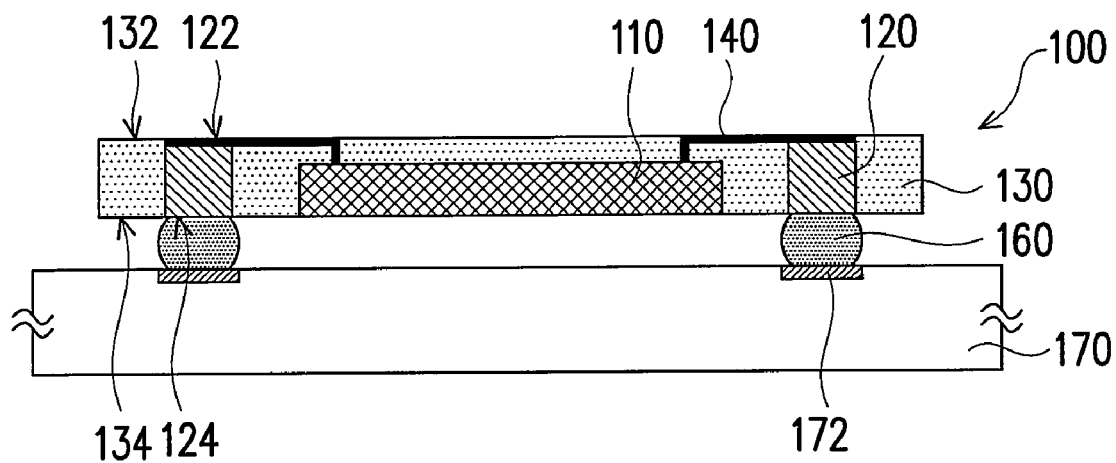

However, in further another embodiment of the invention, a chip packaging structure with conductive pillars having both the first end surface and the second end surface exposed by the encapsulation is provided for specific requirements. Referring to FIG. 5, the chip packaging structure 100 has the encapsulation 130 exposing both the first end surface 122 and the second end surface 124 of the conductive pillars 120. With the conductive pillars 120 having two end surfaces 122 and 124 exposed by the encapsulation 130, it seems more favorable for conducting a stacked packaging process to form a stacked packaging structure which can be applied to, for example, memory device or other stacked packaging products. For a detailed description of other elements and associated disposition within the chip packaging structure, please refer to the aforementioned embodiments, and a detailed description will not be repeated herein.

Figure 6:
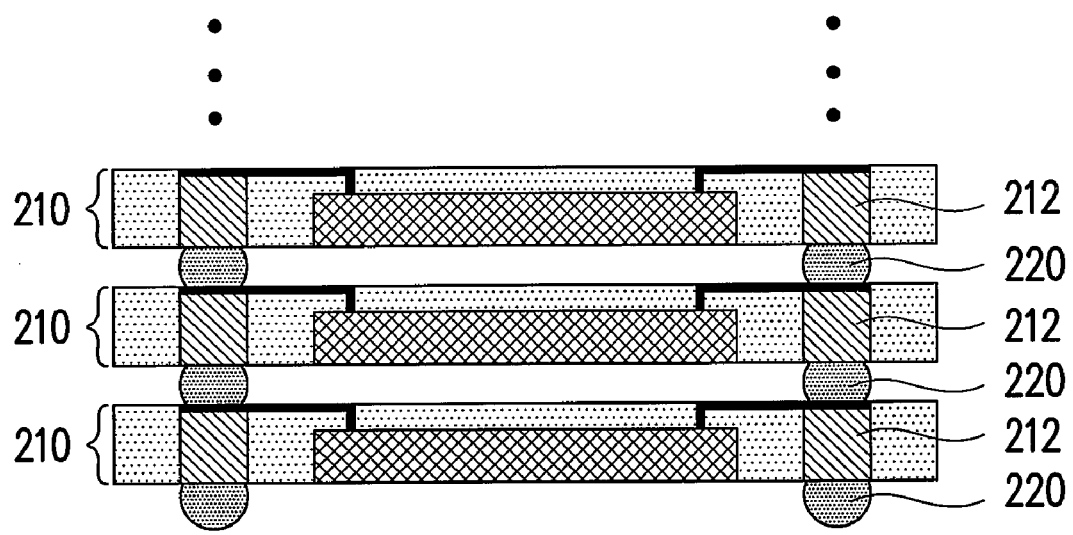
FIG. 6 illustrates a stacked chip packaging structure according to an embodiment of the present invention.

Based on the aforementioned embodiments, a stacked chip packaging structure fabricated by stacking multiple single chip packaging structures selected from one of FIGS. 1-5, preferably the one in FIG. 5, or other embodiments of the present invention is proposed. For instance, FIG. 6 illustrates a kind of stacked chip packaging structure according to an embodiment of the present invention. Referring to FIG. 6, the stacked chip packaging structure 200 comprises a plurality of chip packaging modules 210 and a plurality of connecting elements 220, wherein each chip packaging module 210 is, for example, the chip packaging structure 100 as shown in FIG. 6. In addition, the connecting elements 220 may be solder balls 160 as mentioned above, or other conductive paste. By disposing the connecting elements 220 between the corresponding conductive pillars 212 of two adjacent chip packaging modules 210, the chip packaging modules 210 are bonded and electrically connected to one another to form the stacked chip packaging structure 200. For a detailed description of other elements and associated disposition within the chip packaging structure, please refer to the aforementioned embodiments, and a detailed description will not be repeated herein.

Chip packaging processes accompanying the aforementioned chip packaging structures are described in the following.

Figure 7A:
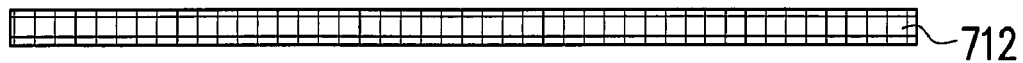
FIGS. 7A-7K illustrate a chip packaging process according to an embodiment of the present invention.
Figure 7B:
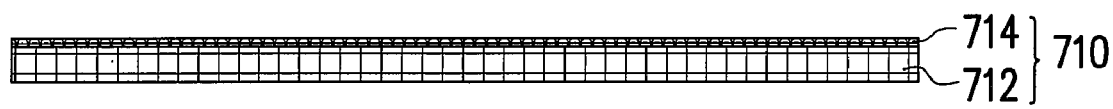

FIGS. 7A-7K illustrate a chip packaging process according to an embodiment of the present invention. First, as shown in FIGS. 7A and 7B, a carrier 710 is provided. In this embodiment, the carrier is, for example, fabricated by plating a barrier layer 714 on a base layer 712. The base layer 712 can be made of copper (Cu), nickel-iron alloy (Ni—Fe 42 alloy), or other applicable metal material. In addition, the material of the barrier layer 714 may be nickel (Ni).

Figure 7C:
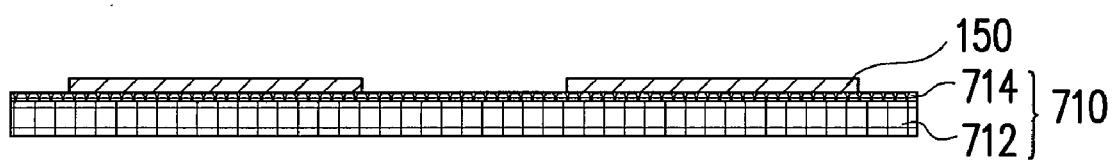
Figure 7D:
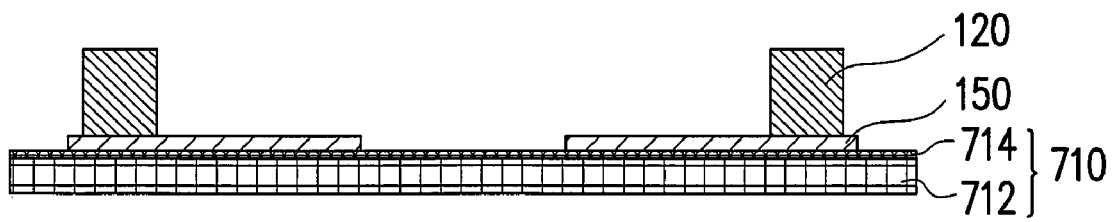

Next, as shown in FIG. 7C, a trace layer 150 is formed over the carrier 710, wherein the trace layer 150 may be a multi-layered structure, including Au/Cu/Au. The trace layer 150 may be formed by performing a plating process with a patterned mask (not shown). Then, as shown in FIG. 7D, a plurality of conductive pillars 120 is formed over the carrier 710. Through the trace layer 150, the conductive pillars 120 can be formed by performing a plating process. The material of the conductive pillars 120 may be copper (Cu).

Figure 7E:
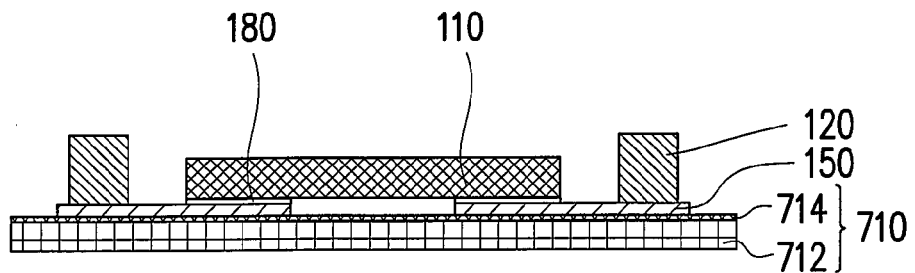

After that, as shown in FIG. 7E, a chip 110 is bonded on the trace layer 150, wherein the conductive pillars 120 surround the chip 110. In this embodiment, the method of bonding the chip 110 to the trace layer 150 may firstly provide an adhesive layer 180 between the chip 110 and the trace layer 150 and then dispose the chip 110 on the trace layer 150 through the adhesive layer 180.

Figure 7F:
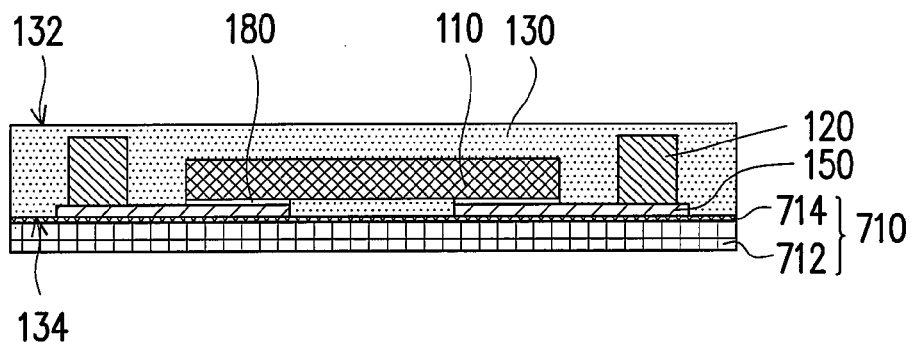
Figure 7G:
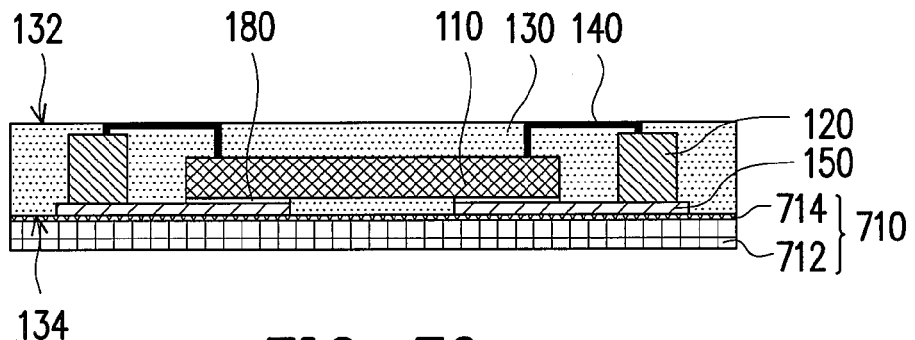
Figure 7H:
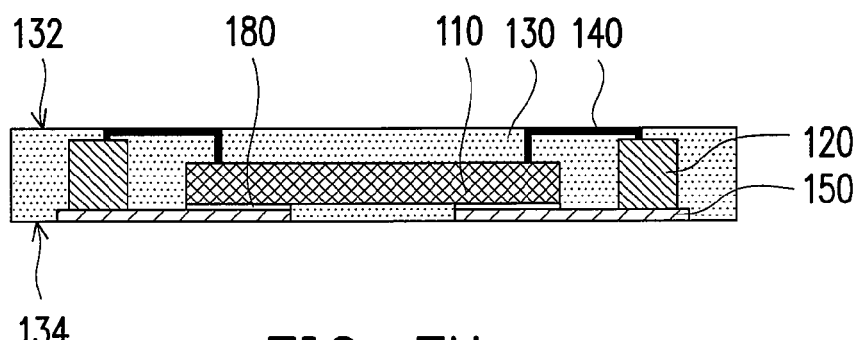

Then, as shown in FIG. 7F, an encapsulation 130 is formed over the carrier 710 for encapsulating the chip 110, the conductive pillars 120, and the trace layer 150. The encapsulation 130 has a first side 132 adjacent to the carrier 710 and a second side 134 far away from the carrier 710. Next, as shown in FIG. 7G, a connecting layer 140 is formed at the first side 132 of the encapsulation 130 for electrically connecting the chip 110 and the conductive pillars 120. After the connecting layer 140 is formed, the carrier 710 is removed by, for example, performing an etching process to form the chip packaging structure 100, as shown in FIG. 7H.

Figure 8A:
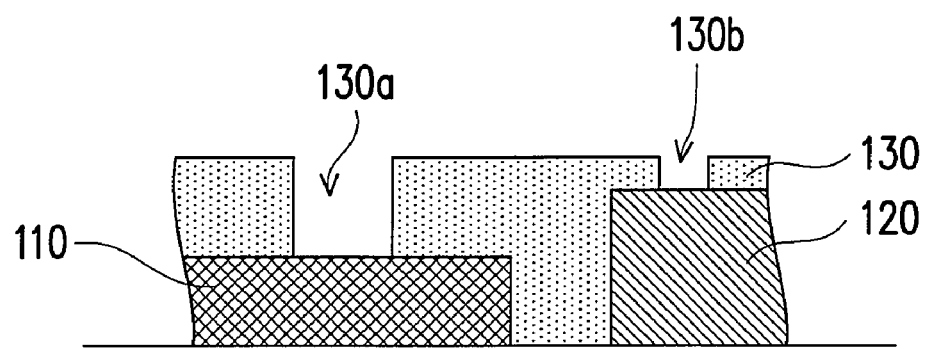
FIGS. 8A-8E illustrate a fabricating process for forming a connecting line as shown in FIG. 7G.

For a detailed description, the process of forming the connecting layer 140 is illustrated in FIGS. 8A-8E. As shown in FIG. 8A, the encapsulation 130 is patterned to form openings 130*a* exposing the chip 110 and openings 130*b* exposing the conductive pillars 120. Specifically, the encapsulation 130 can be made of a photosensitive material and patterned by a photo lithography process. Otherwise, if the encapsulation 130 is non-photosensitive, an etching process performed accompanied with a mask can be conducted to form the openings 130*a* and 130*b*.

Figure 8B:
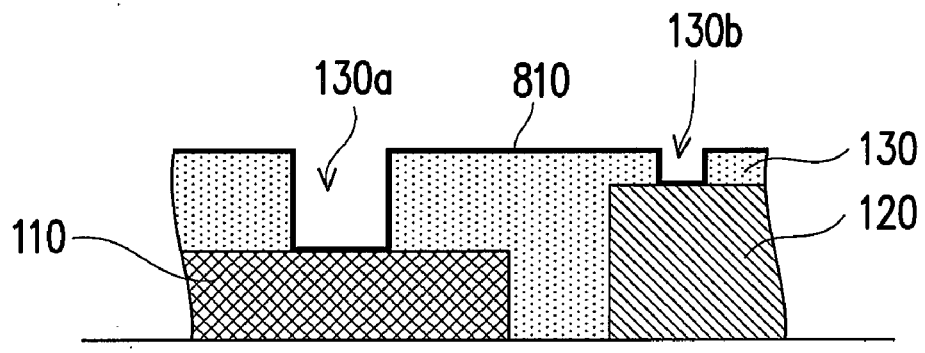
Figure 8C:
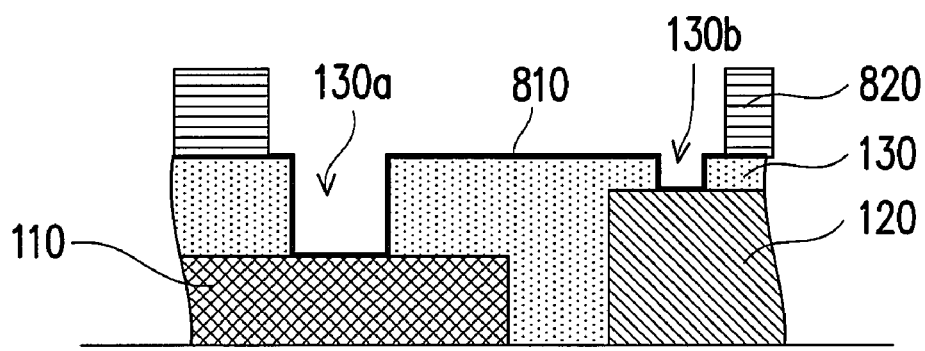
Figure 8D:
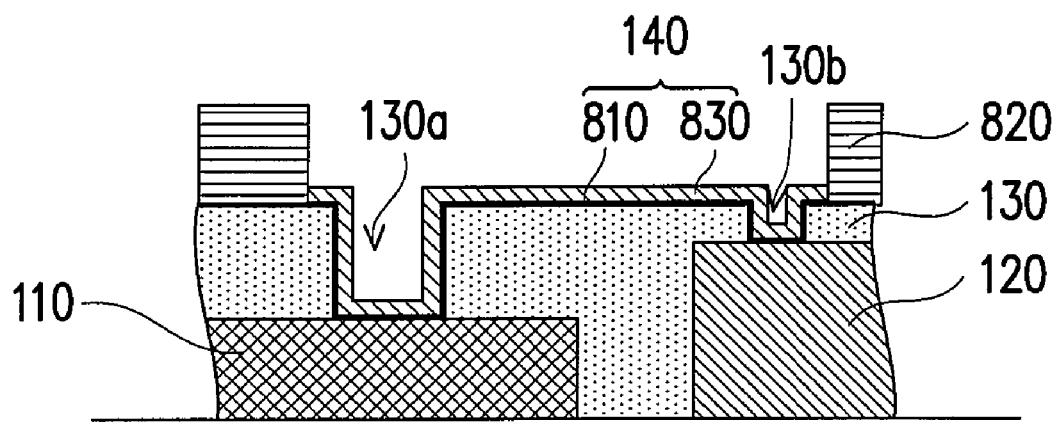
Figure 8E:
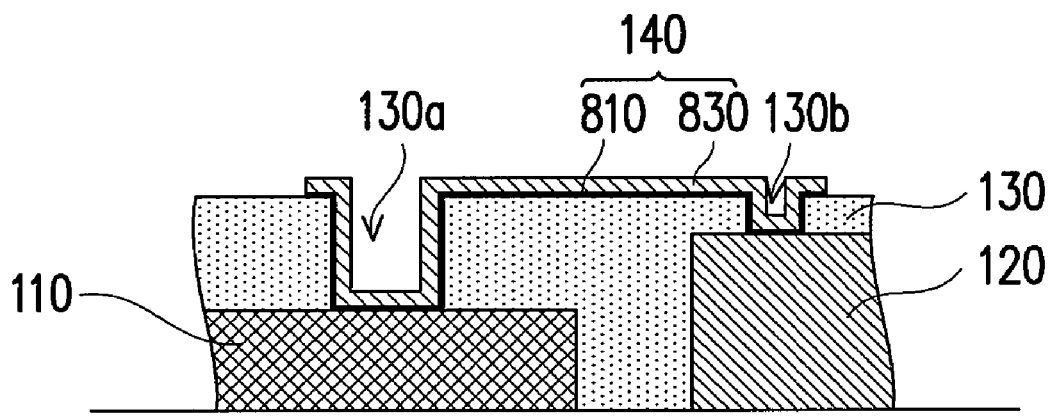

Then, as shown in FIG. 8B, a plating seed layer 810 is formed over the encapsulation 130. Next, as shown in FIG. 8C, a mask 820, such as a photoresist layer, is provided over the encapsulation 130, wherein the mask 820 exposes a part of the plating seed layer 810. After that, as shown in FIG. 8D, a metal layer 830 is formed by performing a plating process through the plating seed layer 810 on the exposes part of the plating seed layer 810. Then, as shown in FIG. 8E, the mask 820 and the other part of the plating seed layer 810 covered by the mask 820 are removed by, for example, performing an etching process. Accordingly, the connecting layer 140 comprising the remained plating seed layer 810 and the metal layer 830 is thereby formed to electrically connect the chip 110 and the conductive pillars 120.

Figure 7I:
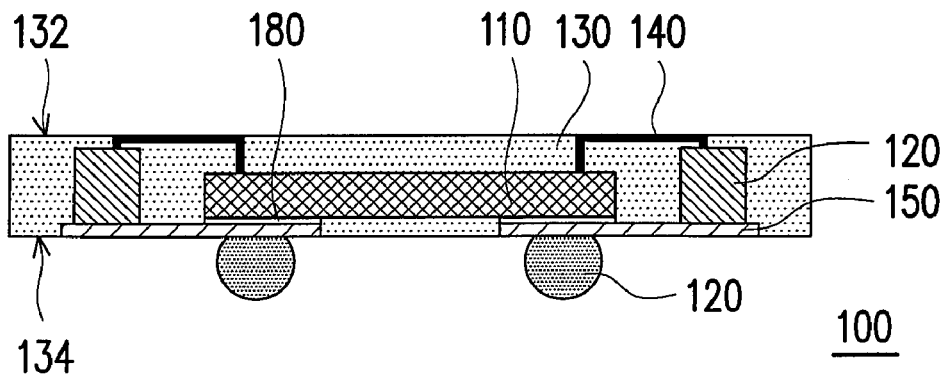

Furthermore, in order to electrically connect the chip packaging structure 100 to external circuitries, a plurality of solder balls 160 may be formed on the second side 134 of the encapsulation 130, as shown in FIG. 7I. The solder balls 160 are electrically connected to the conductive pillars 120 through the trace layer 150.

Figure 7J:
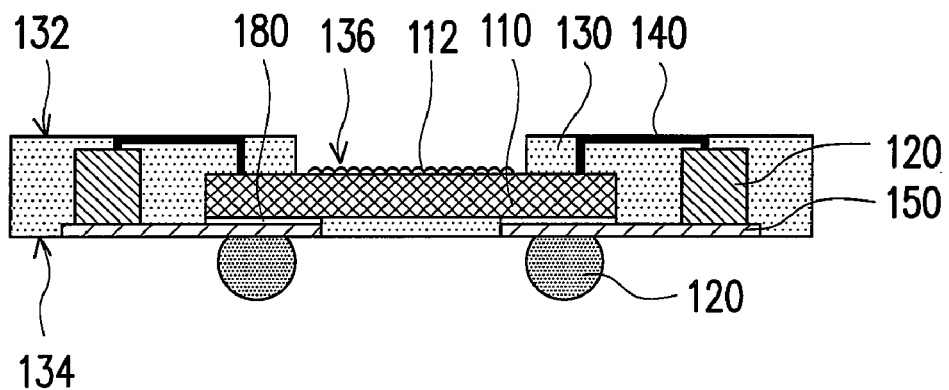
Figure 7K:
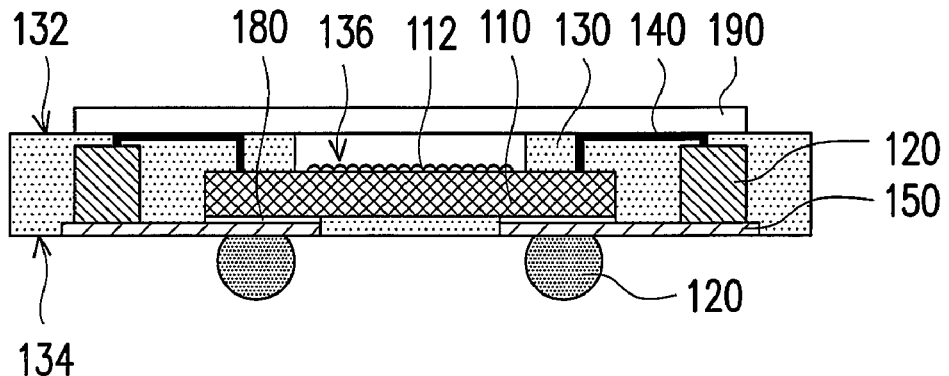

Moreover, as shown in FIG. 7J, if the chip 110 is a sensing device, such as CCD or CMOS image sensor etc., having an active region 112 at the first side 132 of the encapsulation 130, an opening 136 can be formed in the encapsulation 130 for exposing the active region 112 of the chip 110, so that the active region 112 of the chip 110 can receive external light through the opening 136. In addition, as shown in FIG. 7K, a transparent covering plate 190 can be disposed at the first side 132 of the encapsulation 130 to cover the opening 136 and protect the active region 112 of the chip 110. It is noted that if the encapsulation 130 is made of a transparent material and the external light can be incident into the encapsulation 130 directly without the opening 136, the above process shown in FIGS. 7J and 7K can be omitted.

Figure 2:
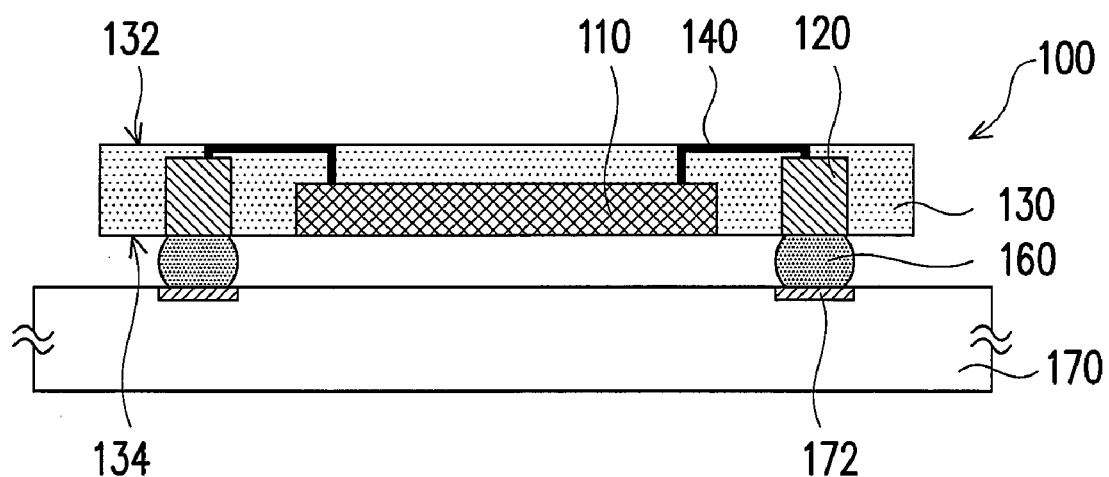
FIG. 2 illustrates another chip packaging structure according to an embodiment of the present invention.

Otherwise, referring to the chip packaging structure 100 in FIG. 2 without the trace layer 150, the formation of the trace layer 150 can further be omitted as disregarding restriction of the circuit layout or for some specific applications, such as the stacked package. And, the solder balls 160 can be directly connected to the conductive pillars 120 without the trace layer 150.

FIGS. 9A-9J illustrate another chip packaging process according to an embodiment of the present invention. For a detailed description of other elements and associated disposition within the chip packaging process, please refer to the aforementioned embodiments, and a detailed description will not be repeated herein.

Figure 9A:
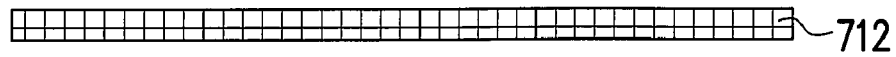
FIGS. 9A-9J illustrate another chip packaging process according to an embodiment of the present invention.
Figure 9B:
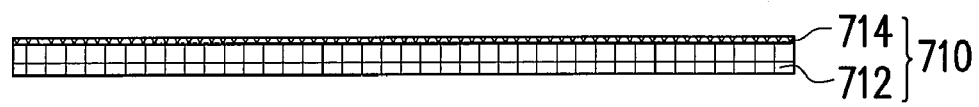
Figure 9C:
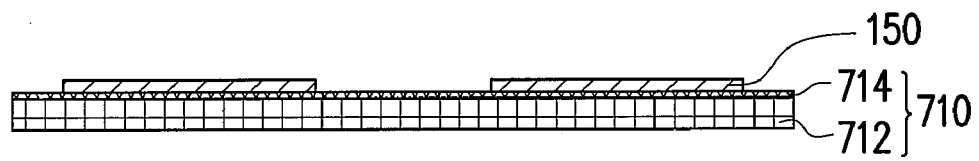

Referring to FIGS. 9A-9C, a carrier 710 having a base layer 712 and a barrier layer 714 on the base layer 712 is provided. A trace layer 150 is formed over the carrier 710 by, for example, performing a plating process.

Figure 9D:
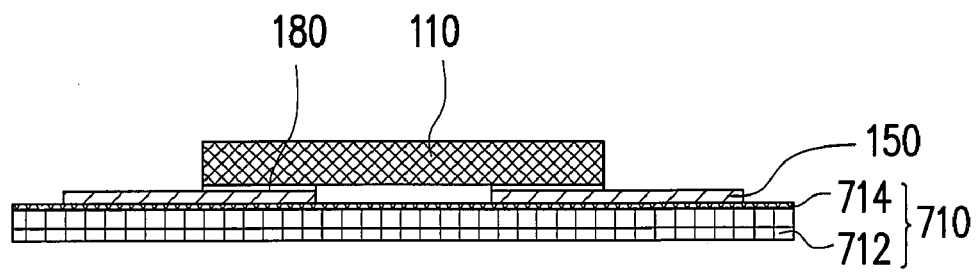
Figure 9E:
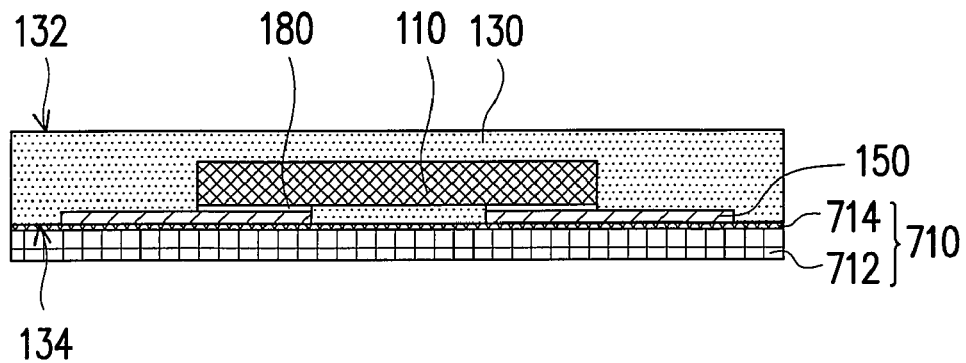

Then, as shown in FIG. 9D, a chip 110 is bonded on the trace layer 150. In this embodiment, the method of bonding the chip 110 to the trace layer 150 may firstly provide an adhesive layer 180 between the chip 110 and the trace layer 150 and then dispose the chip 110 on the trace layer 150 through the adhesive layer 180. Next, as shown in FIG. 9E, an encapsulation 130 is formed over the carrier 710 for encapsulating the chip 110 and the trace layer 150. The encapsulation 130 has a first side 132 adjacent to the carrier 710 and a second side 134 far away from the carrier 710.

Figure 9F:
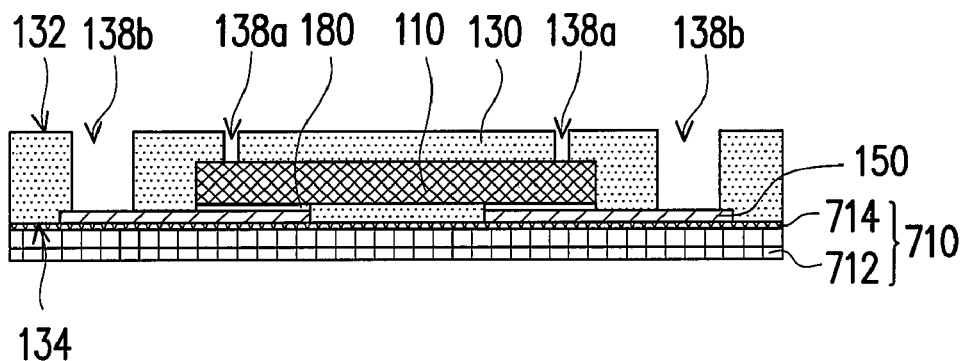

Then, as shown in FIG. 9F, the encapsulation 130 is patterned to form a plurality of first openings 138*a* over the chip 110 and a plurality of second openings 138*b* over the carrier 710 outside of the chip 110, wherein the first openings 138*a* exposes a part of the chip 110 and the second openings 138*b* exposes a part of the carrier 710 outside of the chip 110. In this embodiment, the encapsulation 130 can be made of a photosensitive material and patterned by a photo lithography process. Otherwise, if the encapsulation 130 is non-photosensitive, an etching process performed accompanied with a mask can be conducted to form the openings 138*a* and 138*b*.

Figure 9G:
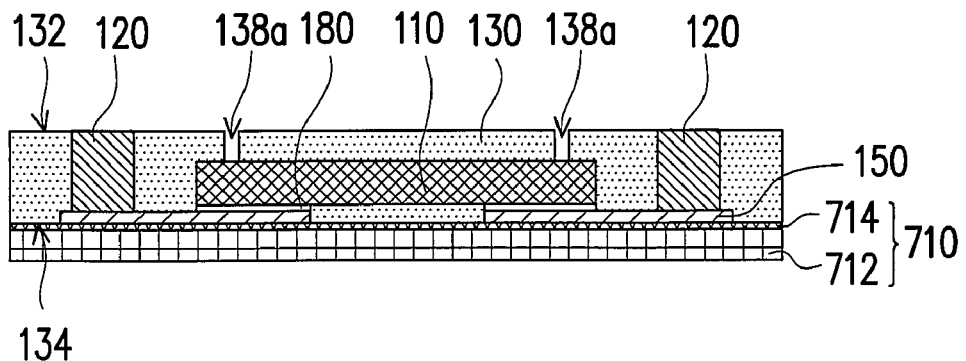
Figure 9H:
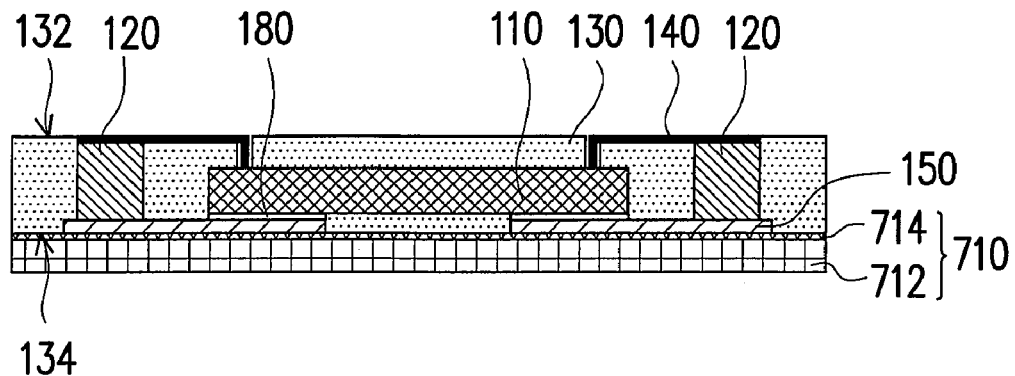
Figure 9I:
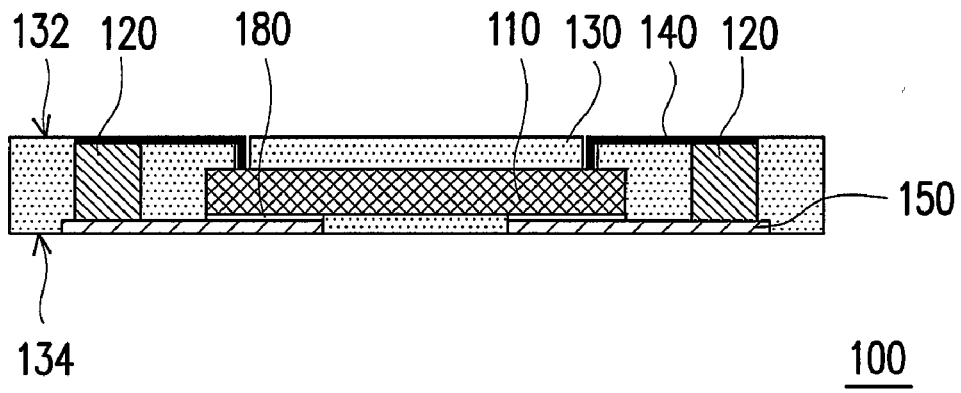

Next, as shown in FIG. 9G, a plating process is performed to form a plurality of conductive pillars 120 in the second openings 138*b* of the encapsulation 130. And then, as shown in FIG. 9H, a connecting layer 140 is formed at the first side 132 of the encapsulation 130 for electrically connecting the conductive pillars 120 and the chip 110 through the first openings 138*a*. In which, the process shown in FIGS. 8A-8E can be conducted to form the connecting layer 140. Then, as shown in FIG. 9I, the carrier 710 is removed by, for example, performing an etching process to form the chip packaging structure 100.

Figure 9J:
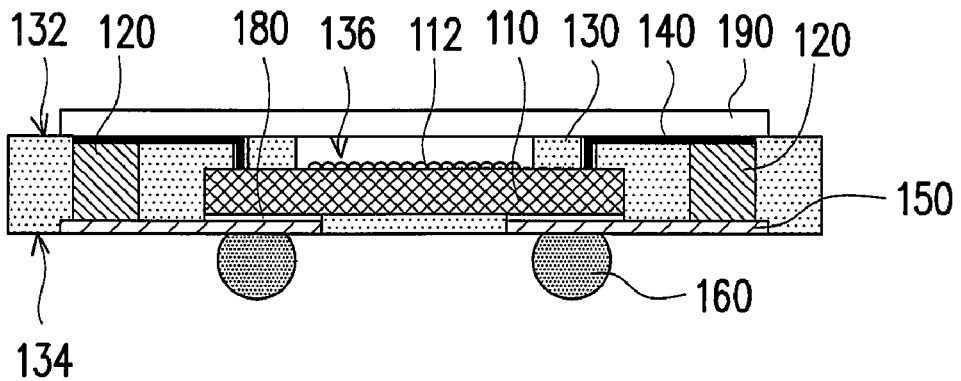

Moreover, as shown in FIG. 9J, a plurality of solder balls 160 may be formed on the second side 134 of the encapsulation 130, wherein the solder balls 160 are electrically connected to the conductive pillars 120 through the trace layer 150.

If the chip 110 is a sensing device, such as CCD or CMOS image sensor etc., having an active region 112 at the first side 132 of the encapsulation 130, an opening 136 can be formed in the encapsulation 130 for exposing the active region 112 of the chip 110, so that the active region 112 of the chip 110 can receive external light through the opening 136. In addition, a transparent covering plate 190 can be disposed at the first side 132 of the encapsulation 130 to cover the opening 136 and protect the active region 112 of the chip 110. It is noted that if the encapsulation 130 is made of a transparent material and the external light can be incident into the encapsulation 130 directly without the opening 136, the above process of forming the opening 136 and disposing the transparent covering plate 190 can be omitted. Furthermore, the formation of the trace layer 150 can also be omitted as disregarding restriction of the circuit layout or for some specific applications, such as the stacked package, and the solder balls 160 can be directly connected to the conductive pillars 120 without the trace layer 150, as shown in FIG. 2.

FIGS. 10A-10H illustrate further another chip packaging process according to an embodiment of the present invention. For a detailed description of other elements and associated disposition within the chip packaging process, please refer to the aforementioned embodiments, and a detailed description will not be repeated herein.

Figure 10A:
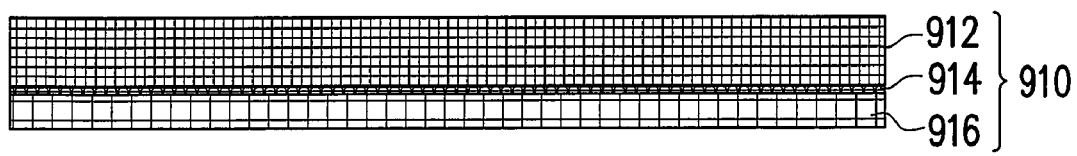
FIGS. 10A-10H illustrate further another chip packaging process according to an embodiment of the present invention.
Figure 10B:
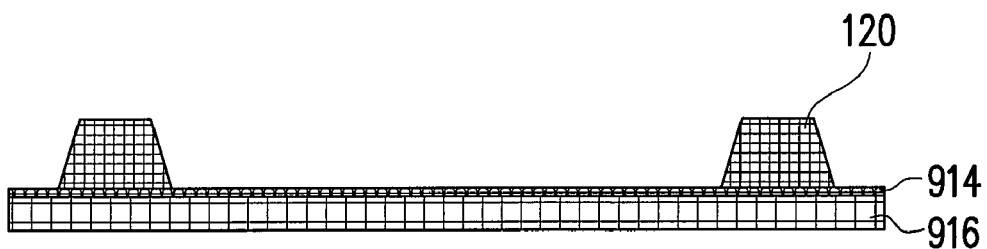
Figure 10C:
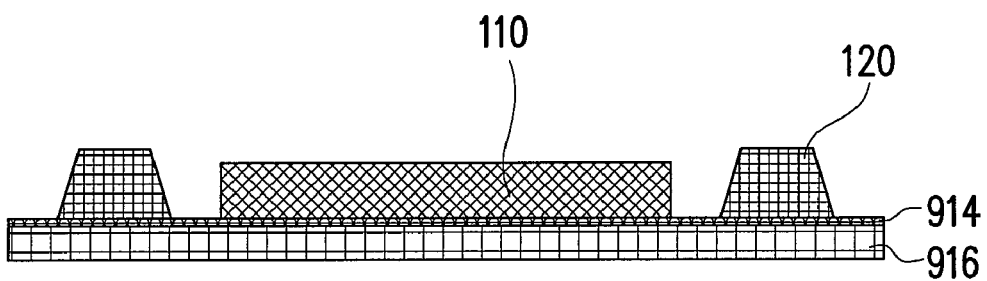

First, as shown in FIG. 10A, a multi-layered substrate 910 comprising a first metal layer 912, a second metal layer 916 and a barrier layer 914 between the first metal layer 912 and the second metal layer 916. In this embodiment, the first metal layer 912 and the second metal layer 916 may be made of copper (Cu), and the barrier layer 914 may be made of nickel (Ni). Then, as shown in FIG. 10B, the first metal layer 912 is patterned to form a plurality of conductive pillars 120. The method of patterning the first metal layer 912 may comprise performing an etching process with a mask (not shown). Next, as shown in FIG. 10C, a chip 110 is disposed on the barrier layer 914, wherein the chip 110 is surrounded by the conductive pillars 120. The chip 110 may be bonded with the barrier layer 914 through an adhesive layer or other manners.

Figure 10D:
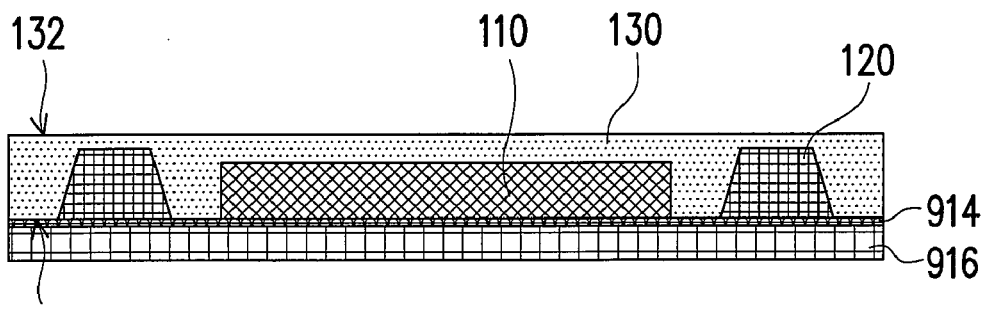
Figure 10E:
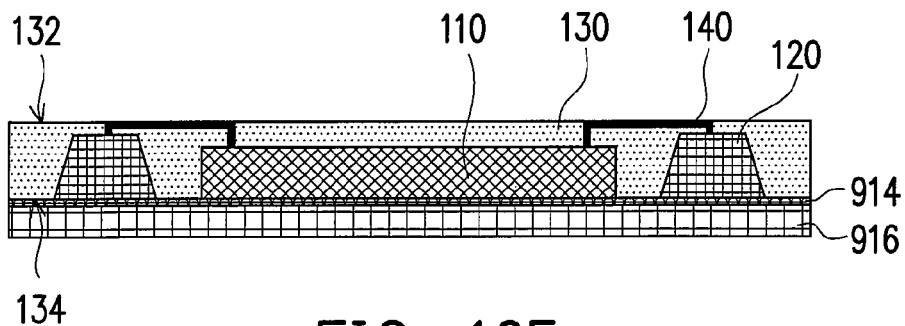
Figure 10F:
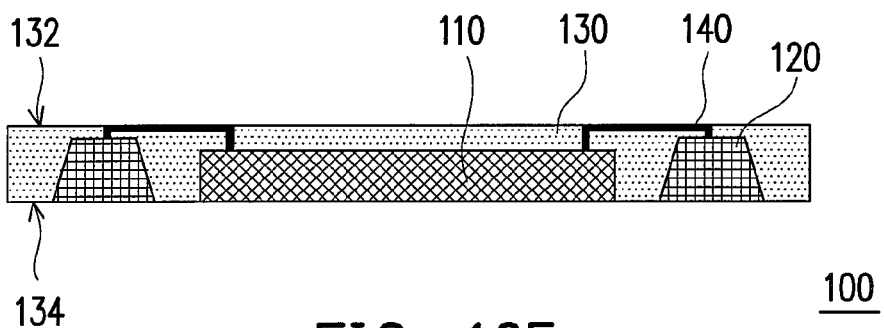

Then, as shown in FIG. 10D, an encapsulation 130 is formed over the barrier layer 914 for encapsulating the chip 110 and the conductive pillars 120. The encapsulation 130 has a first side 132 adjacent to the barrier layer 914 and a second side 134 far away from the barrier layer 914. Thereafter, as shown in FIG. 10E, a connecting layer 140 is formed at the first side 132 of the encapsulation 130 for electrically connecting the conductive pillars 120 and the chip 110. In which, the process shown in FIGS. 8A-8E can be conducted to form the connecting layer 140. Next, as shown in FIG. 10F, the barrier layer 914 and the second metal layer 916 are removed by, for example, performing an etching process, to form the chip packaging structure 100.

Figure 10G:
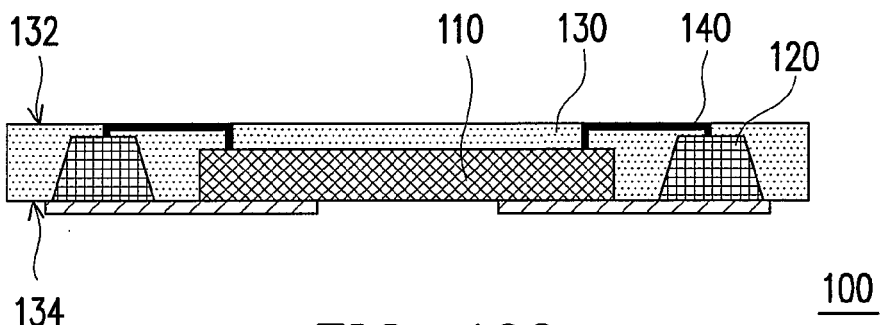

Furthermore, as shown in FIG. 10G, a trace layer 150 can also be formed at the second side 134 of the encapsulation 130 after removing the barrier layer 914 and the second metal layer 916. In addition, as shown in FIG. 10H, in order to electrically connect the chip packaging structure 100 to external circuitries, a plurality of solder balls 160 can be formed on the trace layer 150 of the encapsulation 130, so that the solder balls 160 are electrically connected to the conductive pillars 120 through the trace layer 150.

Figure 10H:
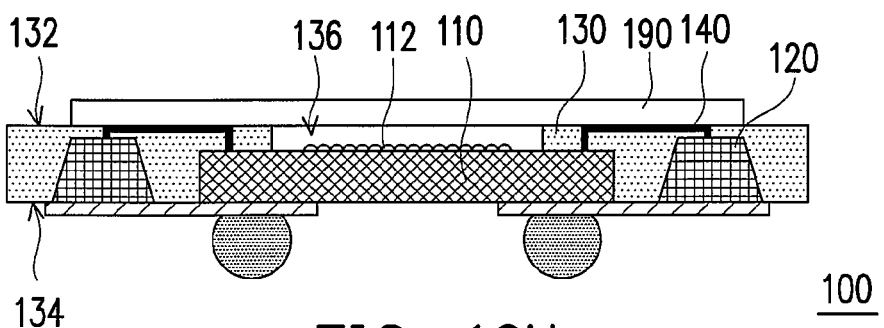

Moreover, referring to FIG. 10H, if the chip 110 is a sensing device, such as CCD or CMOS image sensor etc., having an active region 112 at the first side 132 of the encapsulation 130, an opening 136 can be formed in the encapsulation 130 for exposing the active region 112 of the chip 110, so that the active region 112 of the chip 110 can receive external light through the opening 136. In addition, a transparent covering plate 190 can be disposed at the first side 132 of the encapsulation 130 to cover the opening 136 and protect the active region 112 of the chip 110. It is noted that if the encapsulation 130 is made of a transparent material and the external light can be incident into the encapsulation 130 directly without the opening 136, the above process of forming the opening 136 and disposing the transparent covering plate 190 can be omitted.

It should be noted that the formation of the trace layer 150 can also be omitted as disregarding restriction of the circuit layout or for some specific applications, such as the stacked package, and the solder balls 160 can be directly connected to the conductive pillars 120 without the trace layer 150, as shown in FIG. 2.

In summary, the present invention provides a chip packaging structure and the related chip packaging process for the wafer level package to reduce the manufacturing time and save the production cost. Furthermore, the chip packaging structure of the present invention can be applied to the manufacture of sensing devices, such as CCD or CMOS image sensor, or even memory devices in a stacking type. Therefore, the chip packaging structure and the chip packaging process of the present invention is more useful and powerful and is suitable for various chip packaging applications.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip packaging structure, comprising:
   a chip;
   a plurality of conductive pillars surrounding the chip;
   an encapsulation encapsulating the chip and the conductive pillars, wherein the encapsulation has a first side and a second side opposite to the first side, and the encapsulation consists of a single photosensitive material;
   a connecting layer disposed at the first side of the encapsulation and electrically connected between the chip and a surface of the conductive pillars most approximate to the first side and partially exposed at the first side of the encapsulation, wherein the connecting layer is directly connected to the chip, and
   an external circuitry disposed having a first side and a second side, wherein the first side of the external circuitry is disposed toward the second side of the encapsulation, and no chip is disposed at the second side of the external circuitry.

2. The chip packaging structure according to claim 1, further comprising a trace layer disposed at the second side of the encapsulation and electrically connected to the conductive pillars.

3. The chip packaging structure according to claim 2, further comprising a plurality of solder balls disposed at the second side of the encapsulation and electrically connected to the conductive pillars through the trace layer.

4. The chip packaging structure according to claim 2, further comprising an adhesive layer disposed between the chip and the trace layer.

5. The chip packaging structure according to claim 1, wherein each conductive pillar has a first end surface at the first side of the encapsulation and a second end surface at the second side of the encapsulation, and at least one of the first end surface and the second end surface of each conductive pillar is exposed by the encapsulation.

6. The chip packaging structure according to claim 5, further comprising a plurality of solder balls disposed on the second end surface of each conductive pillar as the encapsulation exposing the second end surface of each conductive pillar.

7. The chip packaging structure according to claim 1, wherein the chip is a sensing device having an active region at the first side of the encapsulation.

8. The chip packaging structure according to claim 7, wherein the encapsulation has an opening exposing the active region of the sensing device.

9. The chip packaging structure according to claim 8, further comprising a transparent covering plate disposed at the first side of the encapsulation for covering the opening.

10. The chip packaging structure according to claim 1, wherein the material of the encapsulation is a photosensitive material.

11. A stacked chip packaging structure, comprising:
a plurality of chip packaging modules, wherein two adjacent chip packaging modules are vertically stacked with each other and each chip packaging module comprises:
   a chip;
   a plurality of conductive pillars surrounding the chip;
   an encapsulation encapsulating the chip and the conductive pillars, wherein the encapsulation has a first side and a second side opposite to the first side, and the encapsulation consists of a single photosensitive material; and
   a connecting layer disposed at the first side of the encapsulation and electrically connected between the chip and a surface of the conductive pillars most approximate to the first side and partially exposed at the first side of the encapsulation, wherein the connecting layer is directly connected to the chip;
a plurality of connecting elements, electrically connected between the corresponding conductive pillars of two adjacent chip packaging modules; and
only one external circuitry disposed toward the second side of the encapsulation of a first chip packaging module, wherein the first chip package module is the most approximate to the external circuitry among the chip packaging modules.

12. The stacked chip packaging structure according to claim 11, wherein each chip packaging module further comprises a trace layer disposed at the second side of the encapsulation and electrically connected to the conductive pillars and the corresponding connecting elements.

13. The stacked chip packaging structure according to claim 12, wherein each chip packaging module further comprises an adhesive layer disposed between the chip and the trace layer.

14. The stacked chip packaging structure according to claim 11, wherein each conductive pillar has a first end surface at the first side of the corresponding encapsulation and a second end surface at the second side of the corresponding encapsulation, and at least one of the first end surface and the second end surface of each conductive pillar is exposed by the corresponding encapsulation.

15. The stacked chip packaging structure according to claim 14, wherein each connecting element is disposed on the second end surface of the corresponding conductive pillar as the corresponding encapsulation exposing the second end surface of the corresponding conductive pillar.

* * * * *